United States Patent [19]

Prevot

[11] Patent Number: 4,740,772

[45] Date of Patent: Apr. 26, 1988

[54] GRADIENT COIL FOR IMAGE FORMATION DEVICES USING NUCLEAR MAGNETIC RESONANCE

[75] Inventor: Claude Prevot, Antony, France

[73] Assignee: Thomson-CGR, Paris, France

[21] Appl. No.: 918,878

[22] Filed: Oct. 15, 1986

[30] Foreign Application Priority Data

Oct. 18, 1985 [FR] France ............................. 85 15512

[51] Int. Cl.⁴ ............................................. H01F 5/00
[52] U.S. Cl. ..................................... 335/299; 324/320
[58] Field of Search ............... 339/299; 324/318, 319, 324/320, 321

[56] References Cited

FOREIGN PATENT DOCUMENTS

| 3133873 | 3/1983 | Fed. Rep. of Germany ...... 335/299 |
| 2555009 | 5/1985 | France ................................. 335/299 |
| 57-78110 | 5/1982 | Japan ................................... 335/299 |

Primary Examiner—George Harris
Attorney, Agent, or Firm—Oblon, Fisher, Spivak, McClelland & Maier

[57] ABSTRACT

The object of the invention is an improved gradient coil. The improvement consists in making steps in the saddle-shaped conductors that form the coil in order to modify local distortions in the magnetic field produced. It is shown that the correction thus made has little effect on the rest of the field of distribution.

11 Claims, 5 Drawing Sheets

FIG_1
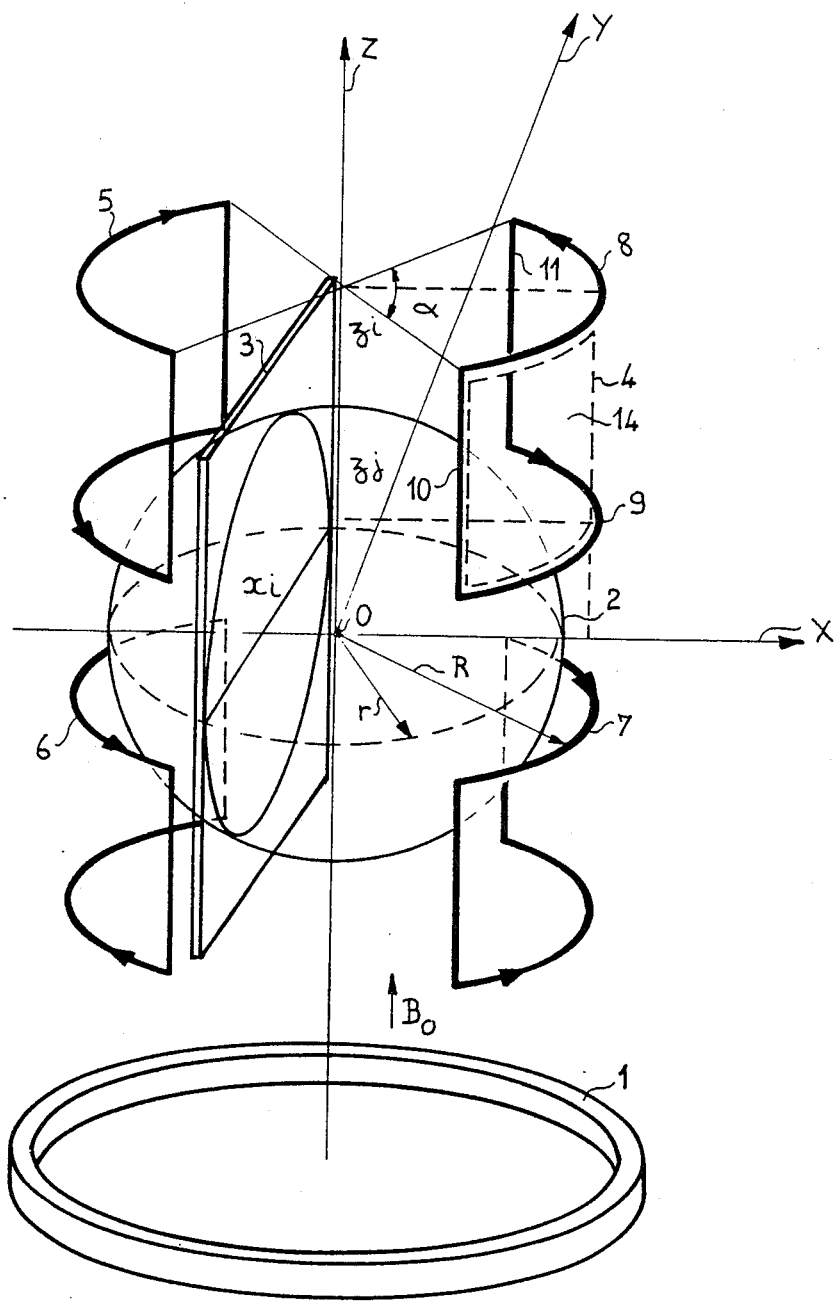

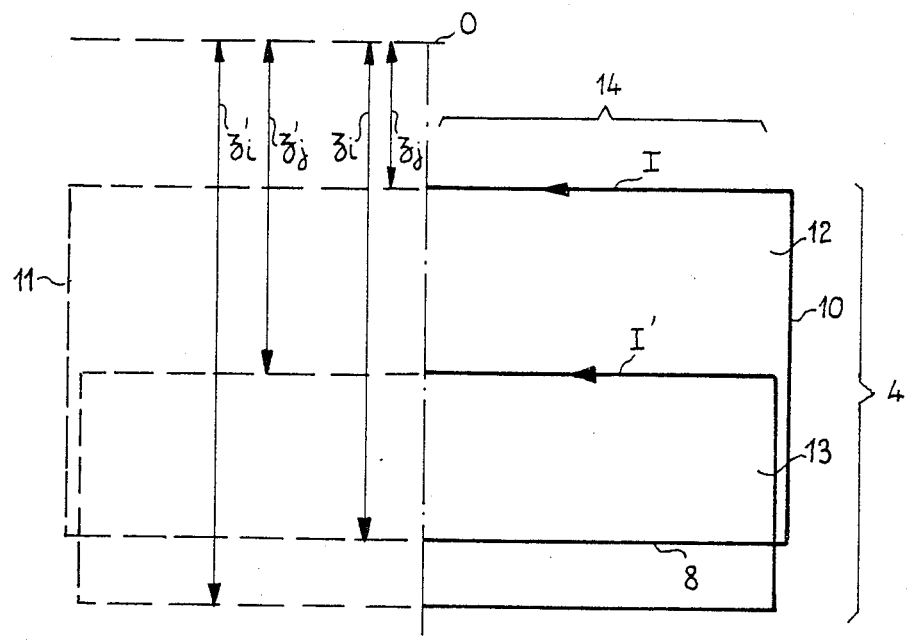
FIG_2
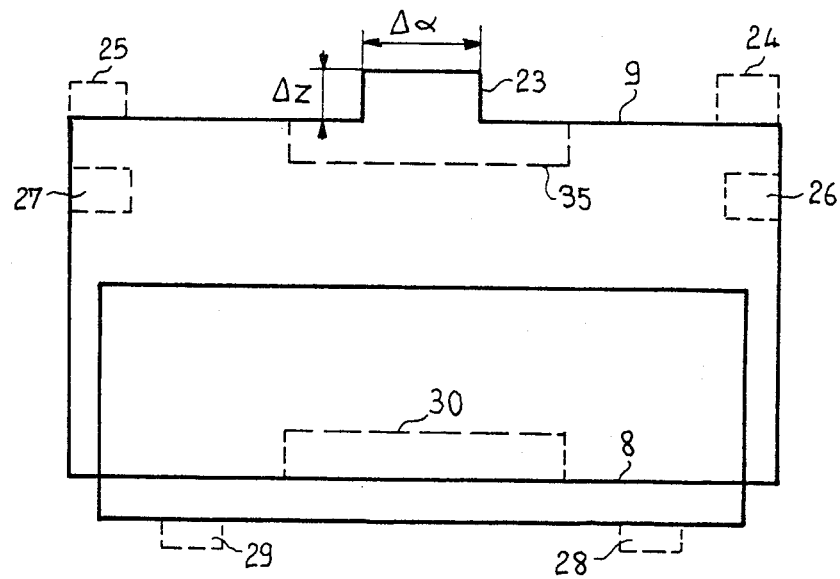
FIG_4

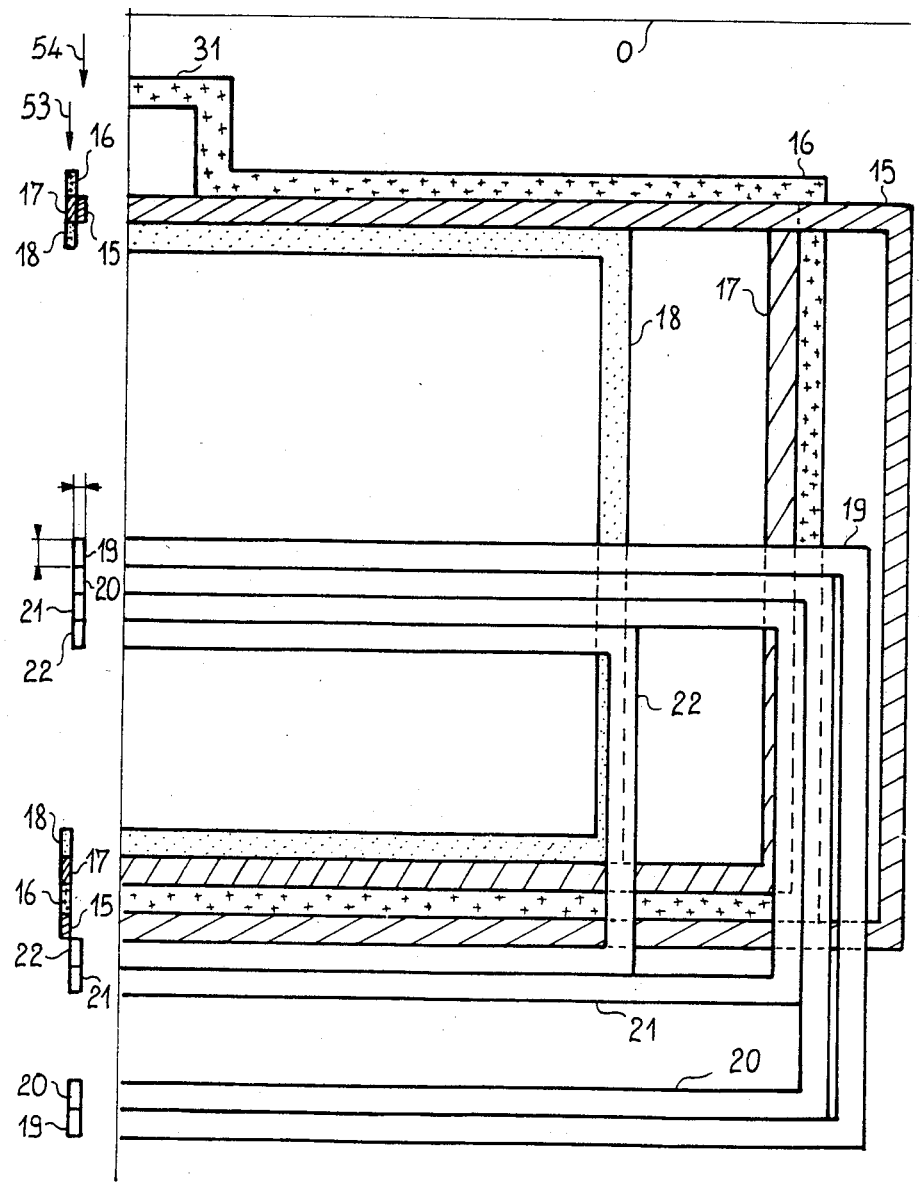
FIG_3-a
FIG_3-b

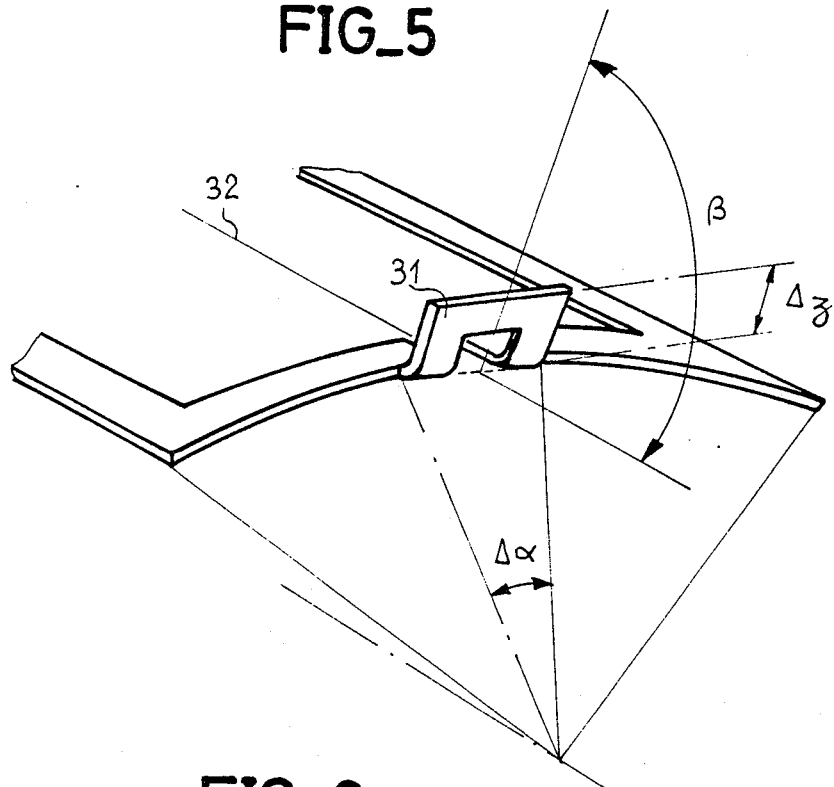
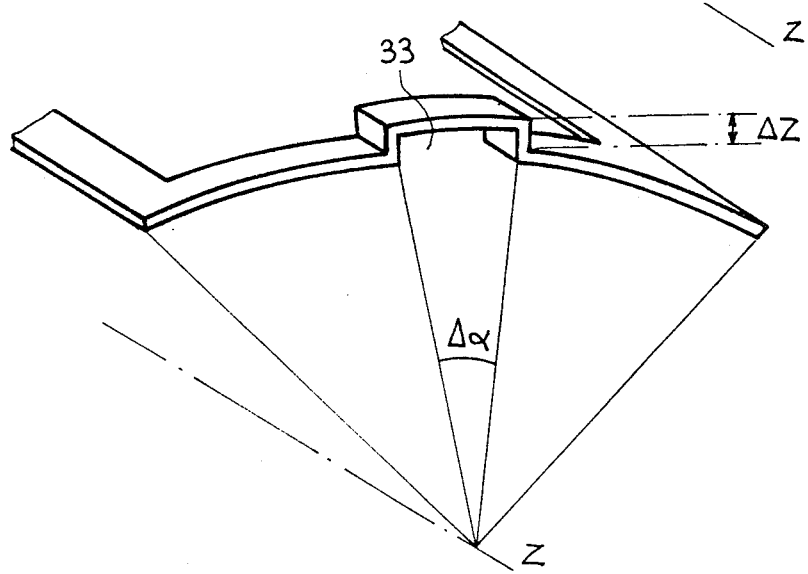

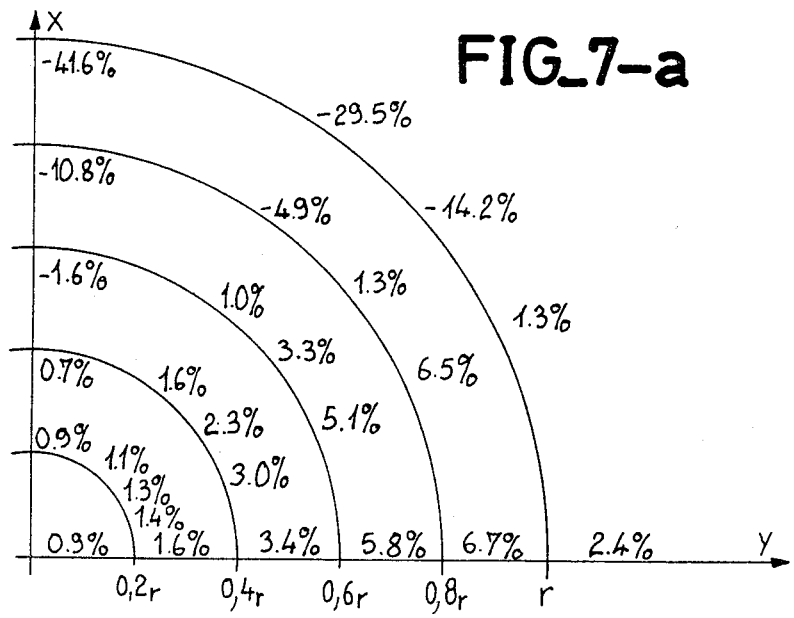
FIG_7-a
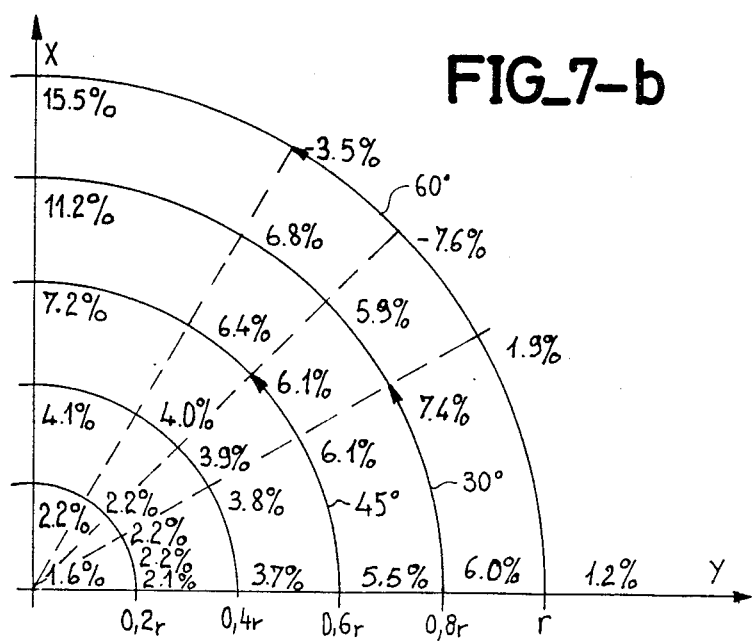
FIG_7-b

GRADIENT COIL FOR IMAGE FORMATION DEVICES USING NUCLEAR MAGNETIC RESONANCE

BACKGROUND OF THE INVENTION

The object of the present invention is an improvement in a gradient coil for image formation devices using nuclear magnetic resonance. The invention has special application in the medical field where image formation by nuclear magnetic resonance is unanimously acknowledged to be a diagnostic aid. Of course, it can be used in other fields. The goal of the present invention is to help create more faithful and higher-resolution images of a body to be examined.

A device for image formation by nuclear magnetic resonance comprises essentially three types of coils. An initial type of coil (which may be replaced if necessary by a permanent magnet) is aimed at creating a strong, homogeneous, magnetic field $B_0$ in a pre-determined space. A second type of coil, known as a radiofrequency coil, is aimed at subjecting a body, which is examined and placed under the influence of the field of the first type of coil, to radiofrequency excitation sequences and at measuring the radiofrequency signal retransmitted by the particles of the body. The radiofrequency response is a response in volume: all the particles of a region of the body subjected to the examination transmit their radiofrequency responses at the same time. To create the image, it is necessary to differentiate among these responses. To this end, image formation devices comprise a third type of coils, known as gradient coils, to superimpose additional field components on the strong field. The value of these components is a function of the coordinates in space of their place of application. In other words, each position in space can be coded by a different field value: the resulting modifications are exploited in the retransmitted signal. Conventionally, it is proposed to structure this differentiation along three mutually perpendicular axes, X, Y, Z. By convention, the Z axis is co-linear with the strong field created by the coils of the first type.

FIELD OF THE INVENTION

Gradient coils are consequently assigned to three classes: those that create a gradient along X, those that create a gradient along Y and those that create a gradient along Z. The more specific, but not the sole, object of the invention is to propose an improvement in the two former classes. A field gradient along X is a magnetic field for which the distribution of the amplitude of the co-linear component in the strong field Z, in space, is a function solely of the coordinate $x_i$ of its place of application. In practice this distribution is even simply proportionate to the said coordinate. This means that all the particles of a body to be examined, located in a plane parallel to Y-Z and with a given abscissa $x_i$, are subjected to a total field $B_0 + G_x \cdot x_i$. The gradient $G_x$ is the slope of the variation of the component along Z of the additional field provided by these X gradient coils.

The acquisition of an image, therefore, requires, during the application of radiofrequency excitation sequences, the concomitant application of field gradient sequences. The field gradient sequences depend on the method of optical image formation used. This method may, for example, be of the 2DFT type developed by Mr. A. KUMAR and Mr. R. R. ERNST or, for example, of the back projection type developed by Mr. P.C. LAUTERBUR. Regardless of the method of image formation chosen, the chief characteristic of field gradients relates to their homogeneity. Homogeneity is taken to mean compliance (with a given tolerance value and for a real field gradient) with an ideal theoretical distribution which is sought to be laid down. For divergences result in falsifying the differentiation that is sought to be imposed in the space under examination, this differentiation being the very basis of optical image formation. From this point of view problems of homogeneity have to be resolved as much for the gradients as for the strong, homogeneous field. The bigger the gradient coils, the more can we consider the distribution of the fields produced by them to be homogeneous. This tendency, however, is contrary to considerations of the power needed to produce field gradients. Hence, gradient coils are, as a rule, placed on the exterior and as close as possible to radiofrequency coils. These radiofrequency coils determine, in their interiors, a volume of examination in which the body is placed.

DESCRIPTION OF THE PRIOR ART

Coils comprising conductors, formed around a cylinder in a so-called saddle-shaped contour, are known in the prior art. The coils of the invention may be of this type but have specific features designed to provide the most efficient solution to the twofold problem of homogeneity and the electric power to be used to create field gradients, using gradient coils, the position of which is fixed outside a given cylinder, the said cylinder corresponding to a tunnel in which to insert the body to be examined. In the invention, we have discoverd a specific structure of the conductors of these coils providing an efficient solution to a problem of homogeneity without appreciably increasing their self-induction. It will be shown that with the conductors of the invention, at comparable field strengths and levels of self-inductance, local field divergences can be reduced.

SUMMARY OF THE INVENTION

The object of the present invention is a gradient coil for image formation by nuclear magnetic resonance, of a type comprising conductors each shaped around a cylinder, these conductors being assembled in an even number of identical arrangements symmetrical with respect to a pre-determined examining space, wherein at least one of the conductors of each arrangement has at least one step.

BRIEF SUMMARY OF THE DRAWINGS

The invention will be better understood from the following description and the figures that accompany it. The description and figures are given solely as an indication of the invention and are in no way exhaustive. The figures use the same references to designate the same elements. The figures are:

FIG. 1: the general aspect of a coil gradient of an apparatus for image formation.

FIG. 2: a schematic diagram of a layout of the coil used in the invention.

FIGS. 3a and 3b: a view from above and a sectional view of the details of a gradient coil according to a preferred embodiment of the invention.

FIG. 4: a schematic diagram of the steps of the invention.

FIGS. 5 and 6: examples of embodiments of these steps.

FIGS. 7a and 7b: results of measurements showing the improvement provided by the invention.

DESCRIPTION OF THE PREFERRED EMBODIMENT OF THE INVENTION

FIG. 1 depicts an X gradient coil for an apparatus for image formation by nuclear magnetic resonance. This apparatus is symbolised by a coil 1 of the first type which produces a strong field $B_0$, which is oriented along an axis Z. This apparatus has further radiofrequency excitation coils which are not depicted. In general, these radiofrequency coils are distributed on a circular cylinder centered on the Z axis. Their purpose is, by means of a radiofrequency excitation, to excite the particles of a body to be pictured, the body being at least partly within a pre-determined space of examination identified by a sphere 2. The gradient coil depicted is planned so that it produces, in the plane sections 3 identified by their abscissa $x_i$ (i.e. the plane sections parallel to the plane Z-Y), additional magnetic fields, of which the component oriented parallel to Z is a function of the abscissa $x_i$. This coil comprises four arrangements of conductors, marked 4 to 7, which are symmetrical with respect to the centre 0 of the sphere 2. These arrangements of conductors which, in this figure, are represented each time by the layout of a single conductor, are also symmetrical to one another in relation a plane X-Y which is perpendicular to the direction of the strong field at the centre of the volume 2. The conductors are drawn in a so-called saddle-shaped contour. Each contour comprises two arched parts shaped around a cylinder and connected to each other at their ends by two parts which are co-linear with the generators of this cylinder. For example, in the arrangement 4, the arches are 8 and 9 and the generator segments 10 and 11. Naturally, the conductors of the arrangements are, of course, traversed by currents flowing in the required direction to produced the desired gradient. Each conductor of an arrangment is defined by the aperture angle $\alpha$ of the cylinder portion that it describes, and by the altitudes $z_i$ and $z_j$ of the generator segments that it comprises.

The structure depicted in FIG. 1 is known to be suited to the production of additional fields, of which the component oriented along Z varies according to the abscissa $x_i$. For a gradient coil producing an additional field, of which the component oriented along Z varies with the ordinate $y_i$, the same type of coil is made: this coil is quite simply turned by 90° in the space around the axis Z. In a preferred embodiment, to obtain the steepest possible gradient, the altitude $z_j$ of the arch closest to the centre 0 of the sphere under examination is substantially equal to 0.29 times the radius R of the circular cylinder that bears it. Similarly $z_i$, the altitude of the arch farthest from the centre 0, is substantially equal to 1.27R, the most favourable angle $\alpha$ being about 135°. To correct the homogeneity defects of this theoretical (and so-called productive) saddle, another theoretical saddle, called a corrective saddle, is added. The corresponding coordinates $Z'_j$, $z'_i$ and $\alpha'$ of this latter saddle are respectively equal to 0.85 R and 1.50 R and also 135°.

In view of the constraints relating to the field gradient to be used, which typically amount to about 0.8 Gauss per cm., and in view of the ampere-windings needed (about 800 to 1600 ampere-windings), providing a single conductor per saddle is out of the question. In an example where the available output current from the current supply means is about 200 amperes, we are led to increase the conductors of each arrangement. FIGS. 3a and 3b give an idea of an example of the preferred embodiment. The productive saddle has four saddle-shaped conductors (15 to 18), and the corrective saddle also has four conductors 19 to 22. To simplify matters, the same current I flows through every conductor. This special feature is advantageously used to power all the conductors in series. This type of a series connection is a conventional one, as is the power supply. They are not represented here in order to simplify the drawings. FIG. 2 represents an evolute view of one-eighth of an arrangement on side 14 of FIG. 1. This arrangement is also depicted in FIG. 3a. This form of depiction to one-eighth is preferred because it makes it possible to clearly recognize the respective positions of the conductors. By symmetry around a plane that passes through the Z axis and by the middle points of the cylindrical sectors $\alpha$ described by the saddles, it is possible to deduce the rest of the shape of the saddles. In FIG. 2, the depiction to one-eighth is even drawn in the form of dashes. The productive conductors are placed closer to the plane 0, the outline of which appears at the top of the figure. The correcting conductors are placed further from the plane 0 in a superimposed sheet 54, on a lower sheet 53 which contains the productive conductors. FIG. 3b depicts a cross-sectional view of sections of the flat conductors chosen with a thickness e and a width l The angular apertures and the preferred altitudes $z_j$ and $z_i$ of each conductor are given in the following table:

| No. of Conductors | $\alpha$ | $z_j$ | $z_i$ |
|---|---|---|---|
| 15 | 150°00′ | 0,291 R | 1,332 R |
| 16 | 137°18′ | 0,250 R | 1,291 R |
| 17 | 132°42′ | 0,291 R | 1,250 R |
| 18 | 105°00′ | 0,332 R | 1,209 R |
| 19 | 145°24′ | 0,790 R | 1,621 R |
| 20 | 137°18′ | 0,831 R | 1,580 R |
| 21 | 132°42′ | 0,872 R | 1,415 R |
| 22 | 105°00′ | 0,914 R | 1,374 R |

In the invention, we have found an original means of remedying local defects of divergence. This method consists in making, in the arches or straight segments of the saddles, steps 23, or 24-25 or 26-27 or 28-29 or 30, etc., laid on at least one of the conductors of each arrangement. The steps have the same symmetry as the saddles themselves. Angular apertures $\Delta\alpha$ and altitude variations $\Delta z$ can be defined for these steps in the same way as for the saddles. In a preferred manner, $\Delta\alpha$ and $\Delta z$ represent about 5 to 10% of the parameter that they modify. Thus, it is possible to resolve local difficulties in the field chart without substantially modifying all the rest of its distribution. The field modifications thus proposed are adjusted by successive experiments. These experiments are made easier by an additional observation: the steps act locally on the fields that are close to them. If we look at FIG. 4, steps 23 or 35 can be installed on the arch 9 in its middle. The main effect of these steps is to resolve problems of divergence appearing in the zero plane (X-Y), especially along the X axis. By contrast, the main effect of the steps 24-25 or 26-27 or 28-29 or 35, placed either on the edges of the arches or on the generator segments of the productive or corrective conductors, is to resolve problems of divergence which are distributed mainly along the Y axis in planes the altitude (along z) of which varies like the altitude of these steps.

FIGS. 5 and 6 depict practical examples of embodiments of steps according to the invention. In the preferred embodiment where the conductors are flat, the steps may have the aspect of blades such as 31 placed in an arch, the orientation of the plane of these blades forming a given angle $\beta$ with a generator 32 of the cylinder. The advantage of this arrangement is that, in adjusting the angle $\beta$ by varying the uprightness of the blade, the field correction can be adapted to a prescribed value. In a calculated approach determining the dimensions of the step 31, the angle is taken at zero starting point. FIG. 6 depicts an alternative in which the step 33 has the aspect of a notch. That part of the arch which forms the vertex of the notch then lies in an upper (or possibly lower) layer, radially with respect to the layer that bears the biggest part of the conductor. Finally, the step can take any shape whatever, triangular or rounded, instead of being rectangular as indicated.

FIG. 7a and 7b depict, in the zero plane, the influence of a step of type 31, the angle $\beta$ of which is nil and which is placed in the middle of the conductor 16 of the FIG. 3a. FIG. 7a gives a percentage-wise distribution, in the sphere 2, of the real field gradient in relation to a theoretical gradient that must be complied with. Two singular values appear in $Y=0$ and $X=r$ as well as $X=r.\sqrt{3}/2$ and $Y=\frac{1}{2}r$. The radius r is the radius of the sphere 2. The values of $-41.6\%$ and $-29.5\%$ are unacceptable if the permissible homogeneity tolerance is equal, for example, to 15%. FIG. 7b shows what happens to this divergence after a step is added to the conductors 16 as indicated earlier. The amplitude of this step is approximately 10% of $z_j$ and $\alpha$. The main observation made here is that the regions where the degree of homogeneity is unacceptable enter the range of tolerance. Furthermore, the overall homogeneity chart has been modified but, nonetheless, remains within acceptable limits.

What is claimed is:

1. Gradient coil for apparatus forming images by nuclear magnetic resonance of a type comprising conductors, each shaped around a cylinder, these conductors being assembled in an even number of identical arrangements which are symmetrical with respect to the centre of a pre-determined space of examination, wherein at least one of the conductors of each arrangement has at least one step which spacially deviates the path of an electric current which passes through said conductor.

2. Coil according to claim 1 wherein the conductors are each shaped according to a so-called saddle contour.

3. Coil according to claim 1 wherein the even number of arrangements is equal to 4 and wherein the arrangements are equally symmetrical in relation to an axis of symmetry which is parallel to the cylinder and passes through the centre of the space under examination.

4. Coil according to claims 2 or 3 wherein each arrangement presents a plane of symmetry which passes through the axis of symmetry of the arrangements and wherein the steps of a conductor are symmetrical with respect to this plane.

5. Coil according to claim 4 wherein the conductors have two arch-shaped parts around a cylinder, linked by two parts which are co-linear with the generators of this cylinder, wherein the steps are placed in an arch which is as close as possible to the space under examination, so as to correct the field distortions that appear in a plane passing through the centre of the space.

6. Coil according to claim 4 wherein the conductors have two arch-shaped parts around a cylinder, linked by two parts which are co-linear with the generators of this cylinder, wherein the steps are placed in an arch which is furthest from the space under examination, so as to correct field distortions that appear in a plane passing through the periphery of the space.

7. Coil according to claim 4 wherein the conductors have two arch-shaped parts around a cylinder, linked by two parts which are co-linear with the generators of this cylinder, wherein the steps are placed on those conductors that have cylindrical coordinates similar to the cylindrical coordinates of the field distortions which they have the task of reducing.

8. Coil according to any one of claims 1 to 3 wherein the steps are shaped like notches, with an orientation perpendicular to the cylinder generators which determine the shape of the conductor.

9. Coil according to any one of claims 1 to 3 wherein the steps are shaped like blades with their plane forming a given angle with the cylinder generators that determine the shape of the conductors.

10. Coil according to claim 5 wherein the steps are placed in the arch-shaped parts and have a length ranging from about 5% to 10% of these arches.

11. Coil according to claim 5 wherein the steps are placed in the arch-shaped parts and have a height ranging from about 5% to 10% of the altitude of these arches.

* * * * *